United States Patent
Li et al.

(10) Patent No.: US 7,372,387 B2
(45) Date of Patent: May 13, 2008

(54) DIGITAL-TO-ANALOG CONVERTER WITH TRIODE REGION TRANSISTORS IN RESISTOR/SWITCH NETWORK

(75) Inventors: Qunying Li, Basking Ridge, NJ (US); Juergen Luebbe, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/515,105

(22) Filed: Sep. 1, 2006

(65) Prior Publication Data

US 2008/0055135 A1 Mar. 6, 2008

(51) Int. Cl.
*H03M 1/66* (2006.01)
(52) U.S. Cl. .................................. 341/145; 341/144
(58) Field of Classification Search ............... 341/144, 341/145, 154, 150
See application file for complete search history.

(56) References Cited

U.S. PATENT DOCUMENTS

| | | | |
|---|---|---|---|
| 5,808,576 A | | 9/1998 | Chloupek et al. |
| 6,448,916 B1 | * | 9/2002 | Leung ........................ 341/144 |
| 6,570,520 B2 | * | 5/2003 | Ishii ........................... 341/144 |

* cited by examiner

*Primary Examiner*—Peguy JeanPierre
(74) *Attorney, Agent, or Firm*—Wade J. Brady, III; Frederick J. Telecky, Jr.

(57) ABSTRACT

System and method for high-speed and high-precision digital to analog conversion. A preferred embodiment comprises a dual-resistor ladder digital-to-analog converter with a coarse resistor ladder and a fine resistor ladder, wherein resistors in the fine resistor ladder are implemented using transistors. When the effective resistances of switches used in a switching circuit are properly matched with the resistance of the resistors, the differential non-linearity and the integral non-linearity of the digital-to-analog converter can be minimized. The use of transistors to implement switches and resistors can help to eliminate mismatches arising from different fabrication steps and materials, further improving the performance of the digital-to-analog converter.

19 Claims, 14 Drawing Sheets

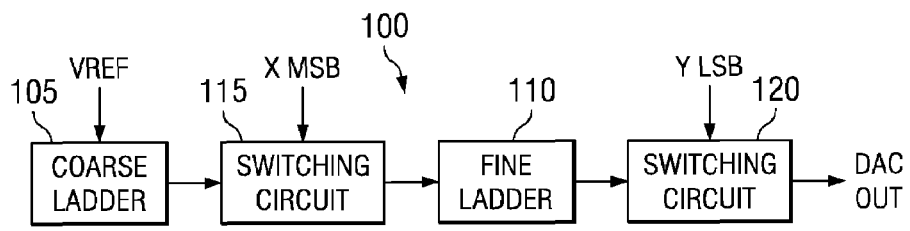
FIG. 1a *(PRIOR ART)*
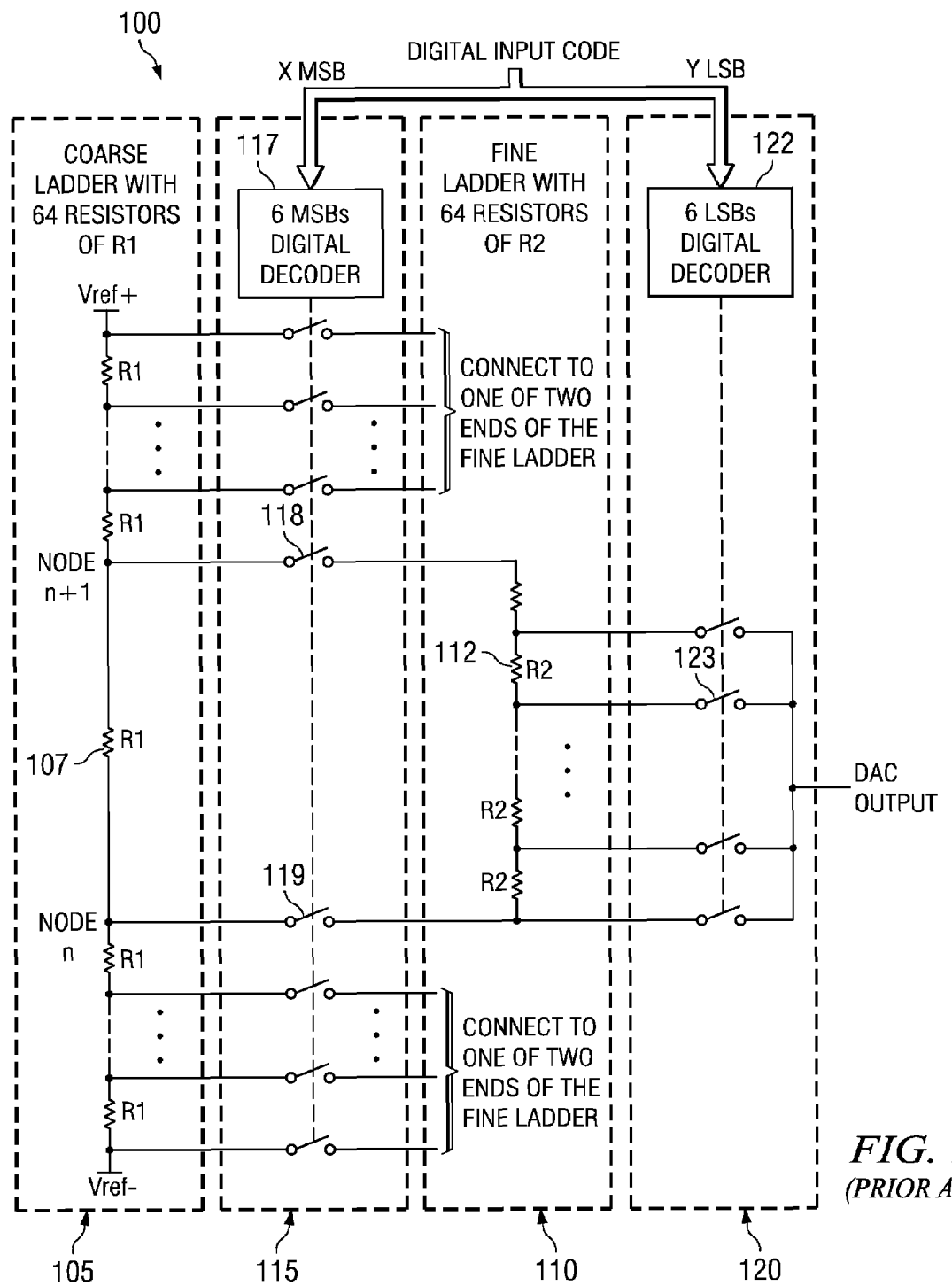
FIG. 1b *(PRIOR ART)*

DIGITAL-TO-ANALOG CONVERTER WITH TRIODE REGION TRANSISTORS IN RESISTOR/SWITCH NETWORK

TECHNICAL FIELD

The present invention relates generally to a system and method for signal processing, and more particularly to a system and method for high-speed and high-precision digital-to-analog conversion.

BACKGROUND

Digital-to-analog converters (DACs) are used in a wide variety of today's electronic devices. DACs can be used in many different applications, such as control systems, positional control systems, digital audio systems, digital video systems, biotechnology sensor systems, and so forth. Depending upon the application, a DAC can be specified with many different performance characteristics, including resolution (a number of bits being converted into an analog signal), conversion speed, linearity, noise, and so forth.

An important performance measure for a precision DAC is the DAC's linearity, i.e., the accuracy of the conversion across the possible range of inputs. The DAC's linearity can be measured by its differential non-linearity (DNL) and integral non-linearity (INL). The DAC's DNL can be expressed as a difference between an expected ideal step output of the DAC and an actual step output of the DAC, while the DAC's INL is the integral of the DNL. A DAC's DNL can be dependent on factors, such as mismatches between resistances of switches and resistors in a dual-resistor ladder DAC, for example.

With reference now to FIG. 1a, there is shown a diagram illustrating a prior art block diagram of a dual-resistor ladder DAC 100. The dual-resistor ladder DAC 100 comprises two resistor ladder networks, a coarse resistor ladder 105 and a fine resistor ladder 110 that are coupled together with a first switching circuit 115. In a typical dual-resistor ladder DAC, all of the resistors in the coarse resistor ladder 105 would have substantially the same resistance and all of the resistors in the fine resistor ladder 110 would have substantially the same resistance to ensure that each voltage step across each resistor in the fine resistor ladder 110 is equally spaced while the fine resistor ladder 110 is being shunted to any resistor in the coarse resistor ladder 105. A voltage reference (VREF), provided to the coarse resistor ladder 105 is divided by the resistors in the coarse resistor ladder 105. A voltage drop across a resistor in the coarse resistor ladder 105, selected by the first switching circuit 115 as a function of the X most significant bits of the binary number being converted, is then provided to the fine resistor ladder 110, where the second switching circuit 120 selects a voltage potential in the fine resistor ladder 110 as a function of the Y remaining bits of the binary number being converted. The binary number being converted is Z bits long, wherein Z=X+Y. The chosen voltage potential in the fine resistor ladder 110, which corresponds to a specific Z bits long digital code is then the output of the dual-resistor ladder DAC 100.

With reference now to FIG. 1b, there is shown a diagram illustrating a prior art implementation of a dual-resistor ladder DAC 100. As shown in FIG. 1b, the coarse resistor ladder 105 can be implemented as a linear sequence of resistors, such as resistor 107, wherein each resistor in the coarse resistor ladder 105 has the same resistance (within manufacturing tolerances). The number of resistors in the coarse resistor ladder 105 can be dependent upon the length of the binary number being converted as well as the number of bits being provided to the first switching circuit 115. For example, if the binary number being converted is 12 bits long and six bits are provided to the first switching circuit 115, then the number of resistors in the coarse resistor ladder 105 is $2^6=64$.

The first switching circuit 115 includes a digital decoder 117, which is capable of decoding the binary bits being provided to the first switching circuit 115 into a signal used to control the state of a plurality of switches, such as switch 118 or switch 119. For example, if six bits are provided to the first switching circuit 115, then the digital decoder 117 could produce either a logic "ON" or a logic "OFF" on 65 signal lines coupled to the 65 switches to control the state of the switches. For example, a particular combination of bit values could result in the digital decoder 117 asserting signals to close switch 118 and switch 119, while having all other switches open in the switching circuit 115, resulting in the coupling of the resistor 107 from the coarse resistor ladder 105 to the fine resistor ladder 110.

The fine resistor ladder 110 includes a linear sequence of resistors, such as resistor 112, wherein each resistor in the fine resistor ladder 110 has the same resistance. The first switching circuit 115 is capable of coupling a first terminal of a resistor in the coarse resistor ladder 105 to the beginning of the linear sequence of resistors in the fine resistor ladder 110 and a second terminal of the resistor in the coarse resistor ladder 105 to the end of the linear sequence of resistors in the fine resistor ladder 110.

The second switching circuit 120 includes a digital decoder 122, which is capable of decoding the binary bits being provided to the second switching circuit 120 into a signal used to control the "ON" or "OFF" state of a plurality of switches, such as switch 123. The binary bits provided to the second switching circuit 120 are the remaining bits from the binary number being converted. For example, if the binary number is 12 bits long and the six most significant bits are provided to the first switching circuit 115, then the second switching circuit 120 is provided with the remaining six less significant bits. The six bits provided to the digital decoder 122 could result in a signal being asserted to one of 64 signal lines coupled to the 64 switches to control the state of the switches. For example, a particular combination of bit values could result in the digital decoder 122 asserting signals to close the switch 123 (while having all other switches in the second switching circuit 120 open) to couple a node below the resistor 112 to the output of the dual-resistor ladder DAC 100.

With reference now to FIGS. 2a and 2b, there are shown diagrams illustrating configurations of a prior art dual-resistor ladder DAC 200, wherein switches in the switching circuits of the dual-resistor ladder DACs are implemented with transistors. MOS transistors, such as NMOS and PMOS transistors, are typically used to implement an integrated version of the dual-resistor ladder DAC 200. The diagram shown in FIG. 2a illustrates two MOS transistors, transistor 212 and transistor 214, out of a plurality of MOS transistors used in the first switching circuit of the dual-resistor ladder DAC 200 to couple resistors, such as resistor 205, of the coarse resistor ladder 105 to the fine resistor ladder 110. The transistor 212 and the transistor 214 couple a first terminal (shown as node 206) and a second terminal (shown as node 207) of the resistor 205 to the fine resistor ladder 110. The fine resistor ladder 110 contains a sequence of resistors "R2" 222. The diagram shown in FIG. 2b illustrates a configuration of the dual-resistor ladder DAC 200 for a different digital input code (X+1 and X+2 as opposed to X for the configuration shown in FIG. 2a, for example), wherein two MOS transistors, transistor 262 and transistor 264, couple a resistor 255 of the coarse resistor ladder 105 to the fine resistor ladder 110. The transistors 262 and 264 couple the first terminal (the node 206) and a second terminal (shown as node 257) of the resistor 255 to the fine resistor ladder 110.

A disadvantage of the dual-resistor ladder DAC 200 as shown in FIGS. 2a and 2b is that there is an error introduced by switches (transistors, such as transistor 212 and transistor 214) between the coarse resistor ladder 105 and the fine resistor ladder 110. For example, when a digital input code changes from X to X+1, a voltage step is expressible as $$\frac{R_2 + 2R_{sw,on}}{2R_{sw,on} + 64R_2}(V_{n+1} - V_n),$$

where $R_2$ is the resistance of the resistors in the fine resistor ladder 110 and $R_{sw,on}$ is the on-state resistance of the switches, and is $$\frac{2R_{sw,on}}{2R_{sw} + 64R_2}$$

larger than the regular voltage step in the fine resistor ladder 110, e.g., when the digital input code changes from X+1 to X+2. In order to minimize this error, the on-state resistance of the switches should be low, which would demand an undesirably large W/L ratio for the switches.

With reference now to FIGS. 3a and 3b, there are shown diagrams illustrating configurations of a prior art dual-resistor ladder DAC 300, wherein the error introduced by switches between the coarse resistor ladder 302 and the fine resistor ladder 328 can be eliminated by altering the on-state resistance of the switches. The elimination of the error introduced by the switches can be achieved by configuring the switches so that a sum of their on-state resistances is substantially equal to the resistance of a resistor in the fine resistor ladder 328. That is, the on-state resistance of the switches between the coarse resistor ladder 302 and the fine resistor ladder 328 is considered as one resistor unit in the fine resistor ladder 328. As a result, one poly resistor R2 in the fine resistor ladder 328 can be removed. Hence, there are now 63 R2 resistors in the fine resistor ladder 328, while there are 64 R2 resistors in the fine resistor ladder 110 (FIG. 2a). Therefore, as shown in FIG. 3a, a voltage potential at a node 325 corresponds to digital input code X+1 when the fine resistor ladder 328 is coupled to a node 306 and a node 307 of the coarse resistor ladder 302 (the two terminals of resistor 305), and the voltage potential at node 355 can correspond to digital code X+2 when the fine resistor ladder 328 is coupled to node 306 and node 308 (the two terminals of resistor 304) of the coarse resistor ladder 302.

The diagram shown in FIG. 3b illustrates the coupling between the coarse resistor ladder 302 and the fine resistor ladder 328 for digital input code X+2, For digital input code X+2, which is one least significant bit (LSB) greater than digital input code X+1, the fine resistor ladder 328 is switched so that it now is coupled to a node 308 and the node 306 (therefore, shunting a resistor 304) in the coarse resistor ladder 302. This can be accomplished by turning off switch 314 and turning on a switch 310 while keeping the switch 312 on. The voltage potential at a node 355 should be the output of the dual-resistor ladder DAC 300 for digital input code X+2, which is one LSB higher than the voltage potential at node 325. The difference between the voltage potentials is due to the presence of the on-state resistance from the switch 312 (resistance=$2*R_{sw,on}=2*R_2/2=R_2$) between the node 355 and the node 306. To ensure that the voltage drop on each resistor in the fine resistor ladder 328 is evenly spaced (to obtain good DNL performance), it is key to maintain the on-state resistance of each switch to be equal to $$R_{sw,on} = \frac{1}{k'\frac{W}{L}(V_G - V_S - V_T)} = \frac{R_2}{2},$$

wherein $V_G$ is the gate voltage of the MOS transistor, $V_S$ is the source voltage of the MOS transistor, $V_T$ is the threshold voltage of the MOS transistor, W/L is the ratio of gate width to gate length, and k' is a dielectric constant.

One disadvantage of the prior art shown in FIGS. 3a and 3b is that the on-state resistance of the MOS transistor, which is operating in a triode region and functioning as a switch, is a function of the source voltage, $V_S$. Unfortunately, in the first switching circuit, the $V_S$ of the MOS transistors changes depending upon the position of the resistor in the coarse resistor ladder 302 to which the MOS transistor is coupled. For example, the $V_S$ for a MOS transistor coupled to a resistor near the top of the coarse resistor ladder 302 will be larger than the $V_S$ for a MOS transistor coupled to a resistor near the bottom of the coarse resistor ladder 302. Since $V_S$ changes for the different MOS transistors, to keep the on-state resistance of each switch equal to $$R_2/2\left(R_{sw,on} = \frac{1}{k'\frac{W}{L}(V_G - V_S - V_T)} = \frac{R_2}{2}\right),$$

the size ratio (W/L) of each MOS transistor must be specifically designed so that each MOS transistor will have substantially the same effective resistance. Furthermore, if the reference voltage of the dual-resistor ladder DAC changes, the effective resistance of the MOS transistors will also change. Therefore, the MOS transistors may need to be redesigned for different customer requirements or for different applications.

Another disadvantage of the prior art shown in FIGS. 3a and 3b is that the resistors and transistors used in the DAC are created using different manufacturing processes (or steps). Therefore, the variances in manufacturing and materials can result in differences in the effective resistances of the resistors and the transistors. Variations in manufacturing, for example, due to differences in materials and temperatures, can result in differences in the resistances of the resistors and transistors as manufactured, resulting in impedance mismatches and increased non-linearity for the DAC.

With reference now to FIG. 4, there is shown a diagram illustrating a prior art implementation of a dual-resistor ladder DAC 400, wherein MOS transistors are used as switches. The dual-resistor ladder DAC 400 features a two-stage decoding/switching mechanism in both a coarse resistor ladder 405 and a fine resistor ladder 425 to help reduce complexity of digital decoding circuitry in the dual-resistor ladder DAC 400. The dual-resistor ladder DAC 400 includes the coarse resistor ladder 405 that comprises a plurality of resistor/switch banks, such as resistor/switch bank 407. The diagram shown in FIG. 4 illustrates the coarse resistor ladder 405 with four resistor/switch banks. However, depending upon the number of binary digits being converted by the coarse resistor ladder 405 as well as the size of the individual resistor/switch banks, the number of resistor/switch banks can differ.

The resistor/switch bank 407 comprises a linear sequence of resistors, such as resistor 408 and resistor 410. Coupled to the linear sequence of resistors are one of two sequences of switches implemented using MOS transistors, with the sequences of resistors made up of MOS transistors such as transistor 409 and transistor 411. A first sequence of switches, such as the sequence that includes the transistor 409, can be coupled to a first terminal of odd numbered resistors, such as resistor 408, in the linear sequence of resistors, while a second sequence of switches, such as the sequence that includes transistor 411, can be coupled to a first terminal of even numbered resistors, such as resistor 410, in the linear sequence of resistors. If the coarse resistor ladder 405 is provided with six binary digits, then an implementation of the coarse resistor ladder 405 can include four resistor/switch banks and each resistor/switch bank can include a linear sequence of 16 resistors with two sequences of eight switches each.

An interconnection bus, shown in FIG. 4 as bus 415, couples a sequence of switches in the coarse resistor ladder 405 to a second level of switches 420. There is a separate interconnection bus 415 for each of the two sequences of switches (labeled as SW1) in the coarse resistor ladder 405 to one of two second level of switches 420 (labeled as SW2). Each of the second level of switches 420 includes multiple switches, such as switch 422, again implemented using MOS transistors. As shown in FIG. 4, the second level of switches 420 includes eight switches, selected using three binary digits from the binary number being converted. The three binary digits are decoded to generate a signal that can be used to close one of the eight switches in both the left side set of switches and the right side set of switches, coupling the coarse resistor ladder 405 to either a top terminal or a bottom terminal of the fine resistor ladder 425. For example, the first sequence of sequence of switches can be coupled to the bottom terminal of the fine resistor ladder 425 while the second sequence of switches can be coupled to the top terminal of the fine resistor ladder 425.

The fine resistor ladder 425 can include a plurality of switch/resistor banks, such as switch/resistor bank 427. The number of switch/resistor banks in the fine resistor ladder 425 can depend upon the size of the individual switch/resistor banks. For example, as shown in FIG. 4, six bits are being decoded by the fine resistor ladder 425 and with each switch/resistor bank having eight resistors (such as resistor 428) and eight switches (such as switch 429). One switch/resistor bank has seven resistors and eight switches. This being due to one resistor being replaced with the on-state resistance of the two switches coupling the coarse resistor ladder 405 and the fine resistor ladder 425. With the number of binary digits being decoded by the fine resistor ladder 425 and the size of the individual switch/resistor banks, there are eight switch/resistor banks in the fine resistor ladder 425. When in operation, the eight switches in one of the eight switch/resistor banks are all turned on simultaneously, then the eight-level outputs of the chosen switch/resistor bank are provided to a bus 430 that couples all outputs from the switch/resistor banks to an output switch bank 435, which includes a plurality of switches, such as switch 437. A number of the bits provided to the fine resistor ladder 425 are used to select one of the switch/resistor banks (as shown in FIG. 4, three bits are used to select one of the eight switch/resistor banks). The remaining bits provided to the fine resistor ladder 425 are then used to select one of the outputs from the selected switch/resistor bank, becoming the output of the dual-resistor ladder DAC 400 (shown in FIG. 4 as $V_{OUT}$).

SUMMARY OF THE INVENTION

These and other problems are generally solved or circumvented, and technical advantages are generally achieved, by preferred embodiments of the present invention which provides a system and a method for high-speed and high-precision digital to analog conversion.

In accordance with a preferred embodiment of the present invention, a digital-to-analog converter (DAC) is provided. The DAC includes a first resistor/switch network including a first linear sequence of resistors and a first sequence of switches, a second resistor/switch network including a second linear sequence of resistors and a first linear sequence of switches, and a third switching network coupled to the first linear sequence of switches. Each switch in the first sequence of switches has a first terminal coupled to a first terminal of a resistor in the first linear sequence of resistors. A first end of the second linear sequence of resistors is coupled to a first switching network and a second end of the second linear sequence of resistors is coupled to a second switching network, wherein resistors in the second linear sequence of resistors comprise transistors operating in a triode region. The third switching network selectively couples a switch in the first linear sequence of switches to an output of the DAC, with the state of the switches in the third switching network being based upon the values of a first portion of binary digits from the binary number being converted.

In accordance with another preferred embodiment of the present invention, a digital-to-analog converter (DAC) is provided. The DAC includes a first resistor/switch network including a first linear sequence of resistors and a first sequence of switches, a second resistor/switch network including a second linear sequence of resistors and a first linear sequence of switches, and a third switching network coupled to the first linear sequence of switches. Each switch in the first sequence of switches has a first terminal coupled to a first terminal of a resistor in the first linear sequence of resistors. A first end of the second linear sequence of resistors is coupled to a first switching network and a second end of the second linear sequence of resistors is coupled to the second switching network, wherein a first resistor in the second linear sequence of resistors being shunted by a first shunt resistor and a first shunt switch linear combination and a last resistor in the second linear sequence of resistors being shunted by a second shunt resistor and a second shunt switch linear combination, wherein the resistors in the second linear sequence of resistors and the first shunt resistor and the second shunt resistor all comprise transistors operating in a triode region. The third switching network selectively couples a switch in the first linear sequence of switches to an output of the DAC, wherein the state of the switches in the third switching network is determined based upon the values of a first portion of binary digits from the binary number being converted.

In accordance with another preferred embodiment of the present invention, a method for designing a dual-resistor ladder digital-to-analog converter (DAC) is provided. The method includes computing a first gate width dimension and a first gate length dimension to meet a desired effective resistance for each transistor used as a resistor in a fine resistor ladder of the dual-resistor ladder DAC, and computing a second gate width dimension and a second gate length dimension to meet a desired effective resistance for each transistor used as a switch in a switching network coupling a coarse resistor ladder to the fine resistor ladder.

An advantage of a preferred embodiment of the present invention is that the fine resistors in the fine resistor ladder are created from transistors, the same type of transistors used as switches in the DAC. Therefore, the same fabrication materials and processes are used to create the resistors and the switches. Hence, there is very little to no process variation between the resistors and switches. Thus, impedance mismatch between the resistors and transistors are minimized, improving the DNL of the DAC.

A further advantage of a preferred embodiment of the present invention is that the transistors used as switches do not need to be scaled for different positions within the coarse resistor ladder or the fine resistor ladder nor for different applications with different voltage ranges. Therefore, a single DAC design can be used in a wide range of applications, simplifying the implementation of the DAC as well as reducing development and production costs.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a and 1b are diagrams of prior art dual-resistor ladder digital-to-analog converters (DACs);

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a dual-resistor ladder DAC wherein N-type MOS transistors are used as switches, wherein the DAC is used in a hard drive voice coil motor control system. The coarse resistor ladder of the dual-resistor ladder DAC is implemented in a two-level design that significantly reduces the complexity of the ladder circuitry. The invention may also be applied, however, to other forms of DACs, such as multi-resistor ladder DACs implemented in three, four, and so forth, level designs. Additionally, other types of transistors, such as P-type MOS transistors, a CMOS transmission gate, and combinations thereof can be used to implement the switches in the DAC. The DAC can also be used in a wide variety of applications, such as in positional feedback control systems, analog and digital video and audio systems, biotechnology and biomedical systems, and so forth.

Figure 2A:
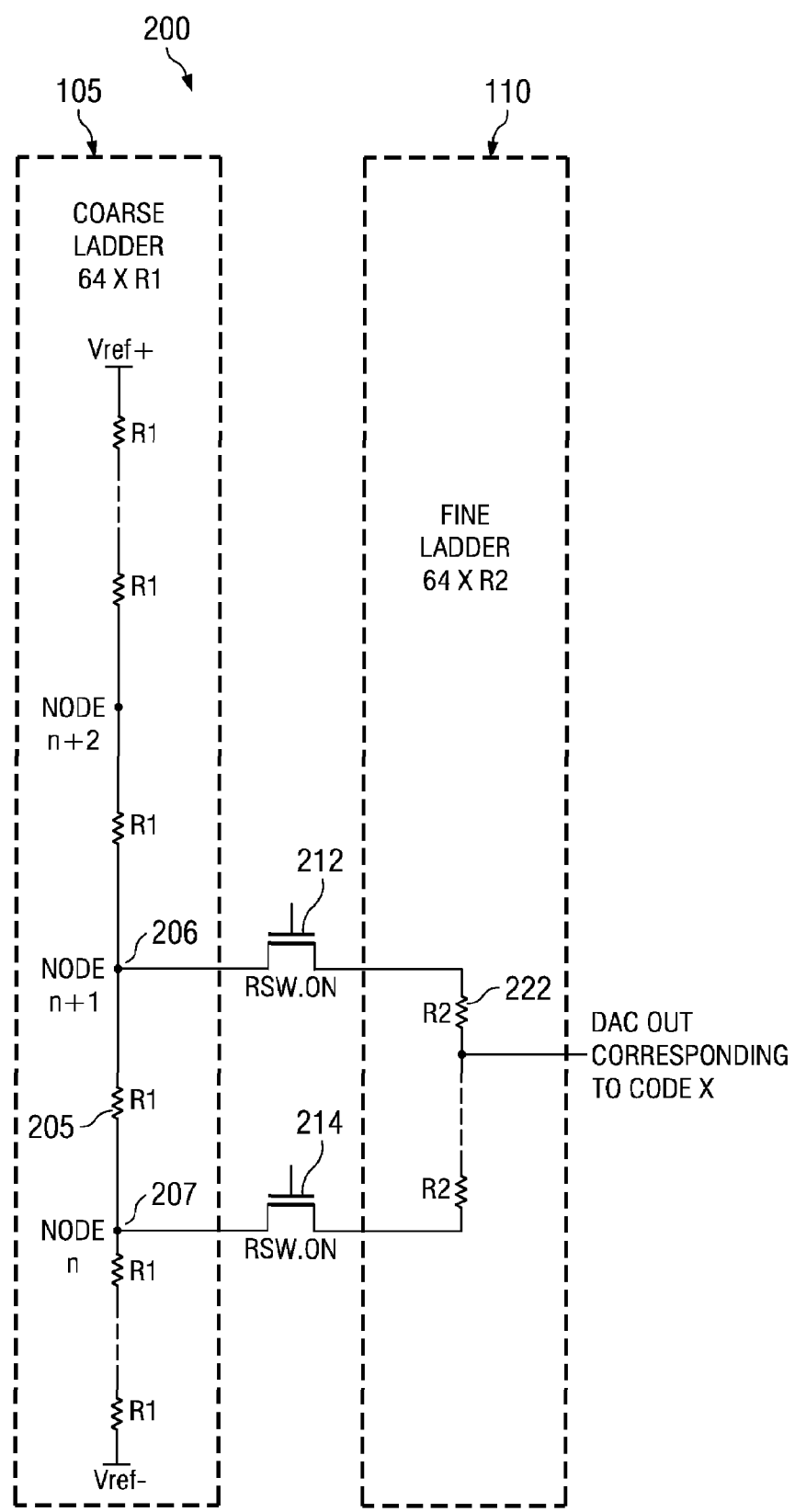
FIGS. 2a and 2b are diagrams of configurations of a prior art implementation of a dual-resistor ladder DAC utilizing transistors as switches.
Figure 2B:
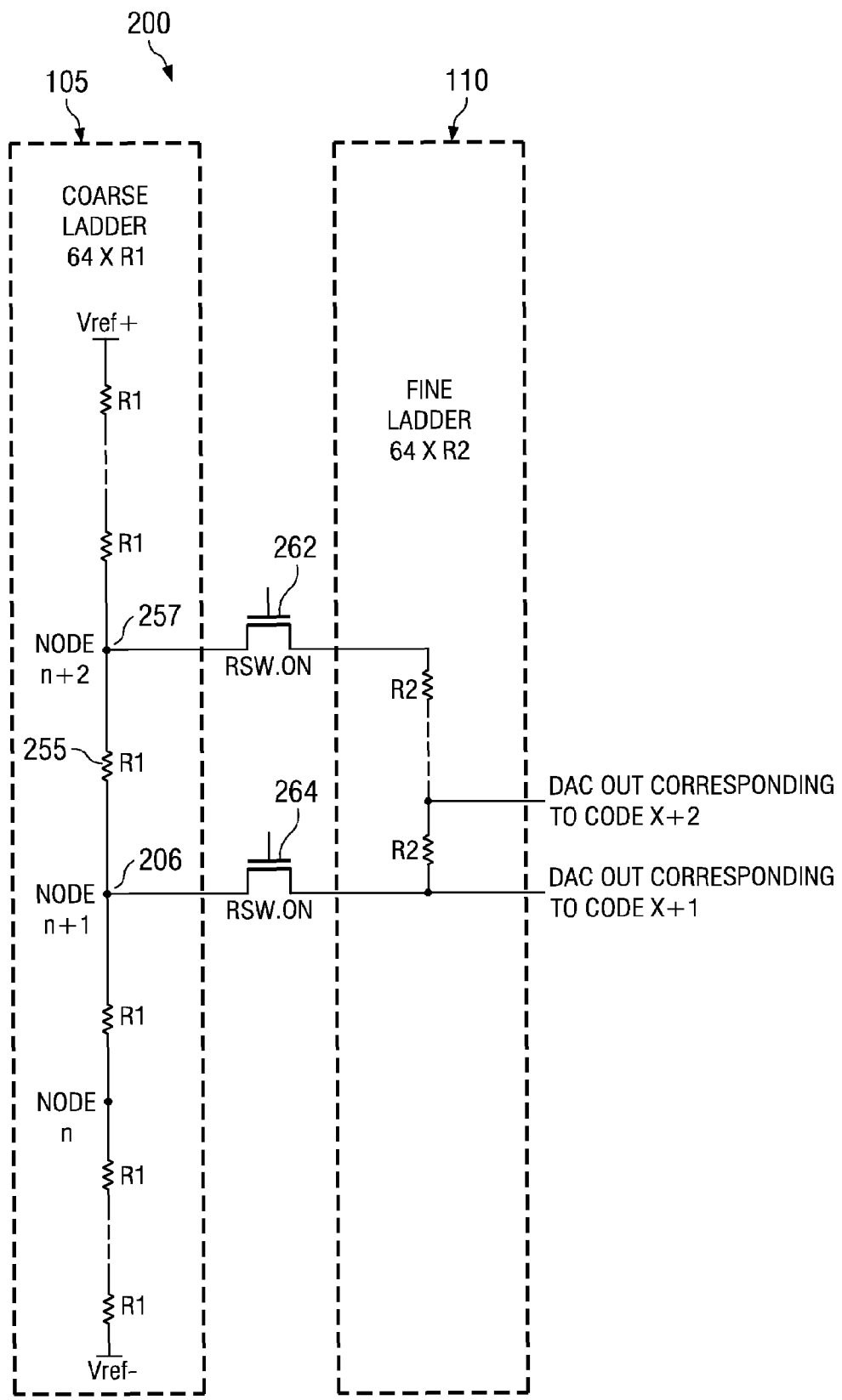
Figure 3A:
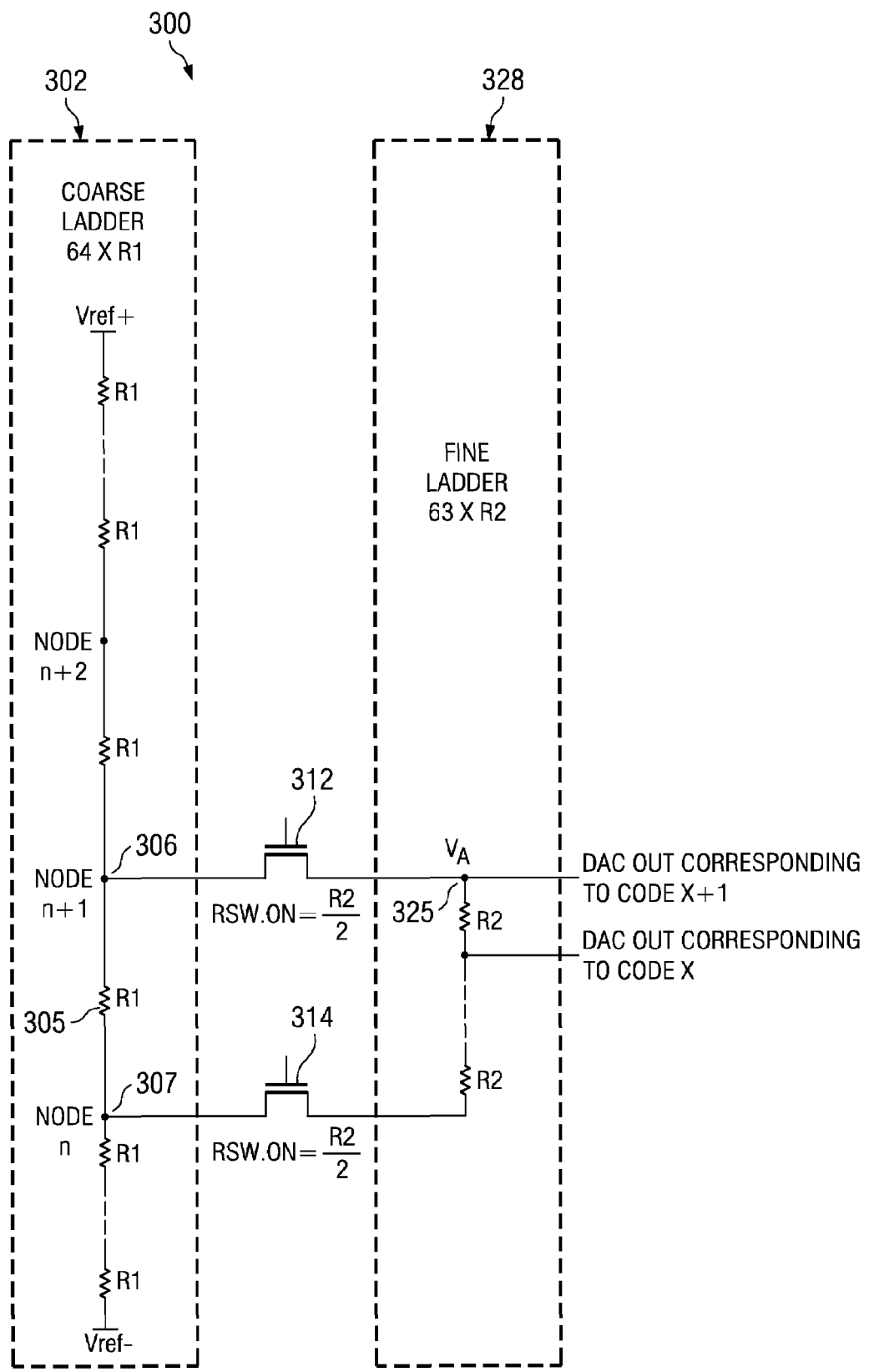
FIGS. 3a and 3b are diagrams of configurations of a prior art implementation of a dual-resistor ladder DAC utilizing transistors with specific on-state resistances as switches.
Figure 3B:
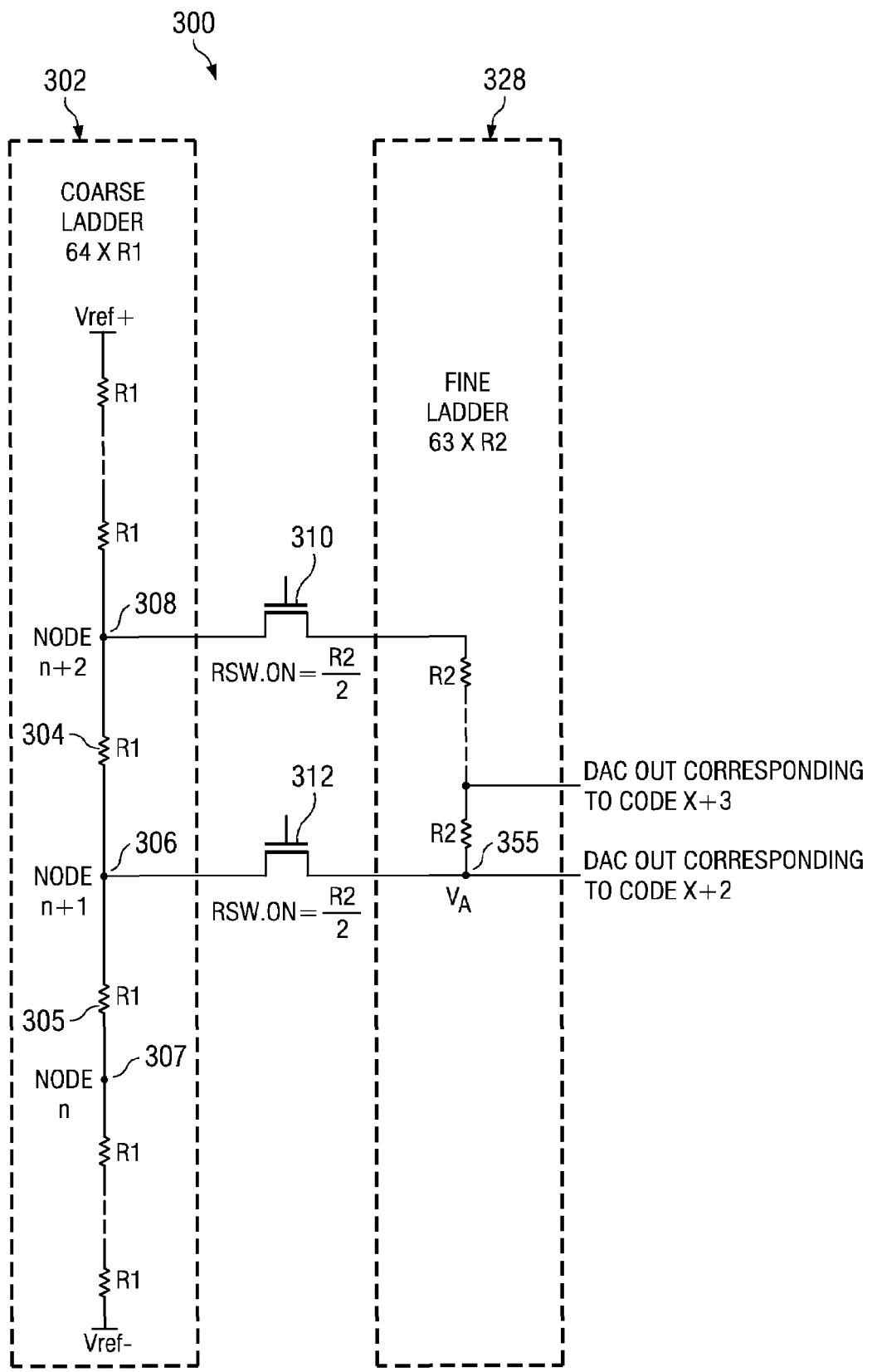
Figure 4:
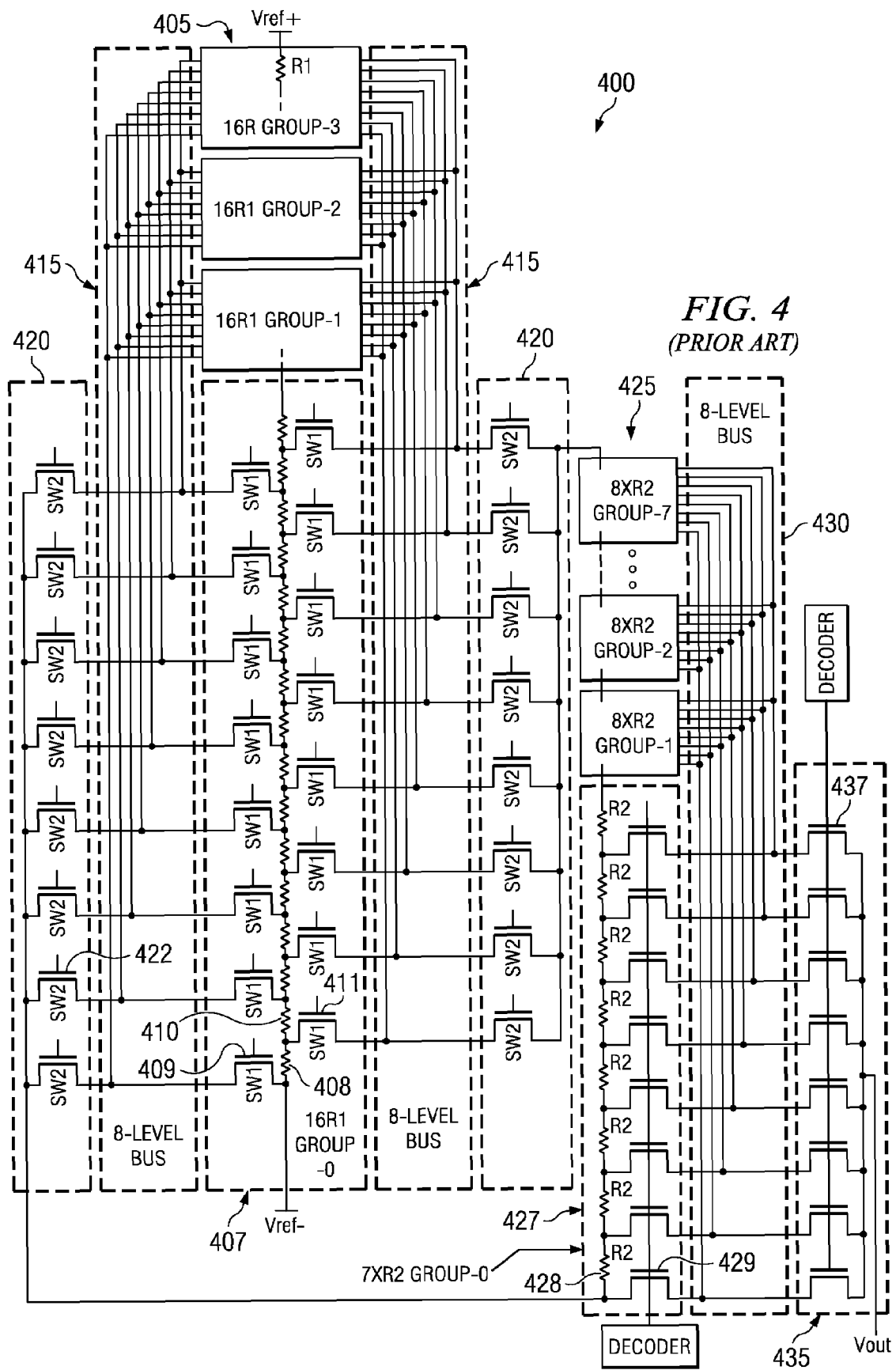
FIG. 4 is a diagram of a prior art two-level implementation of a dual-resistor ladder DAC.
Figure 5A:
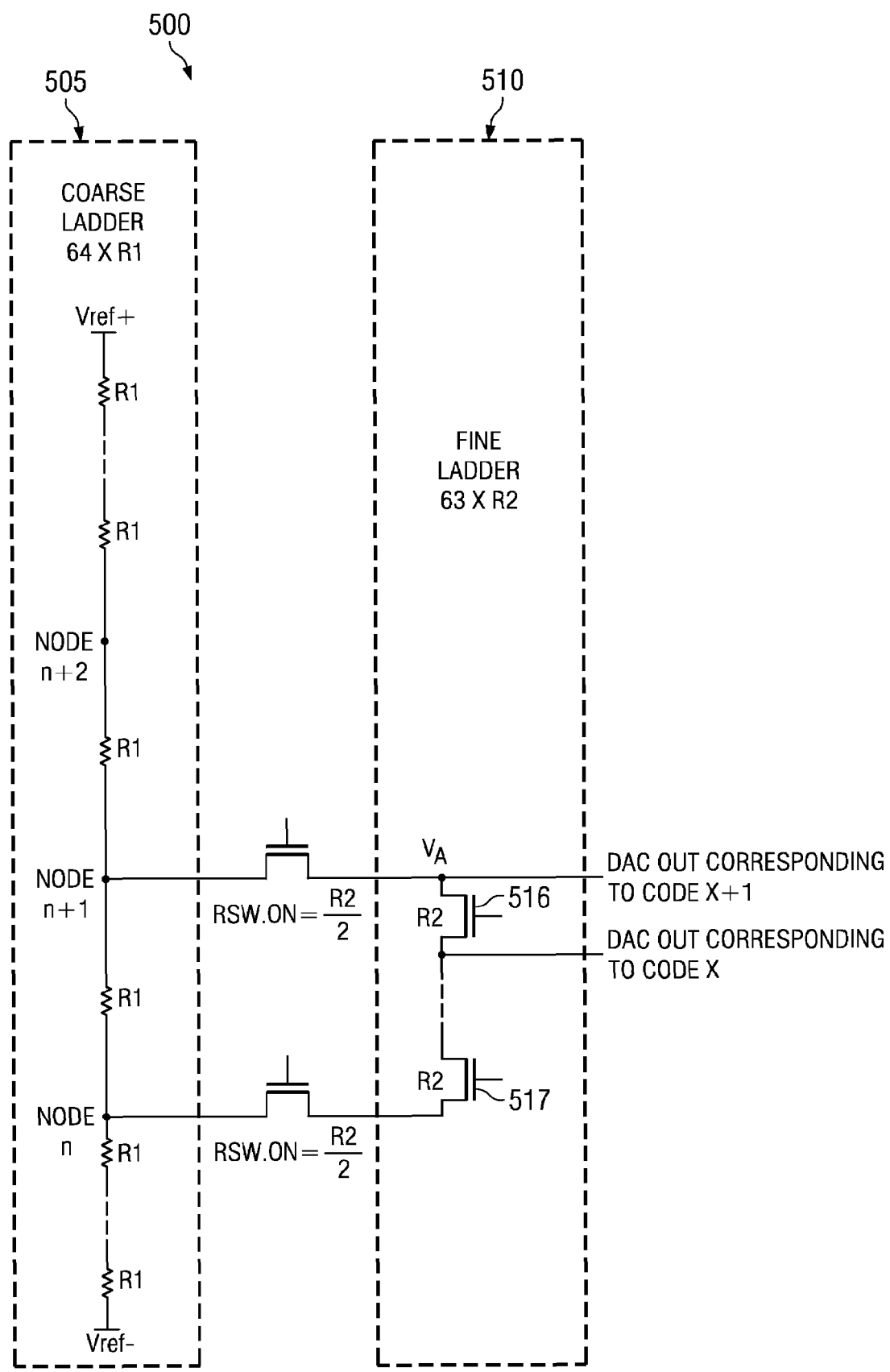
FIGS. 5a and 5b are diagrams of configurations of a dual-resistor ladder DAC utilizing transistors as resistors, according to a preferred embodiment of the present invention.
Figure 5B:
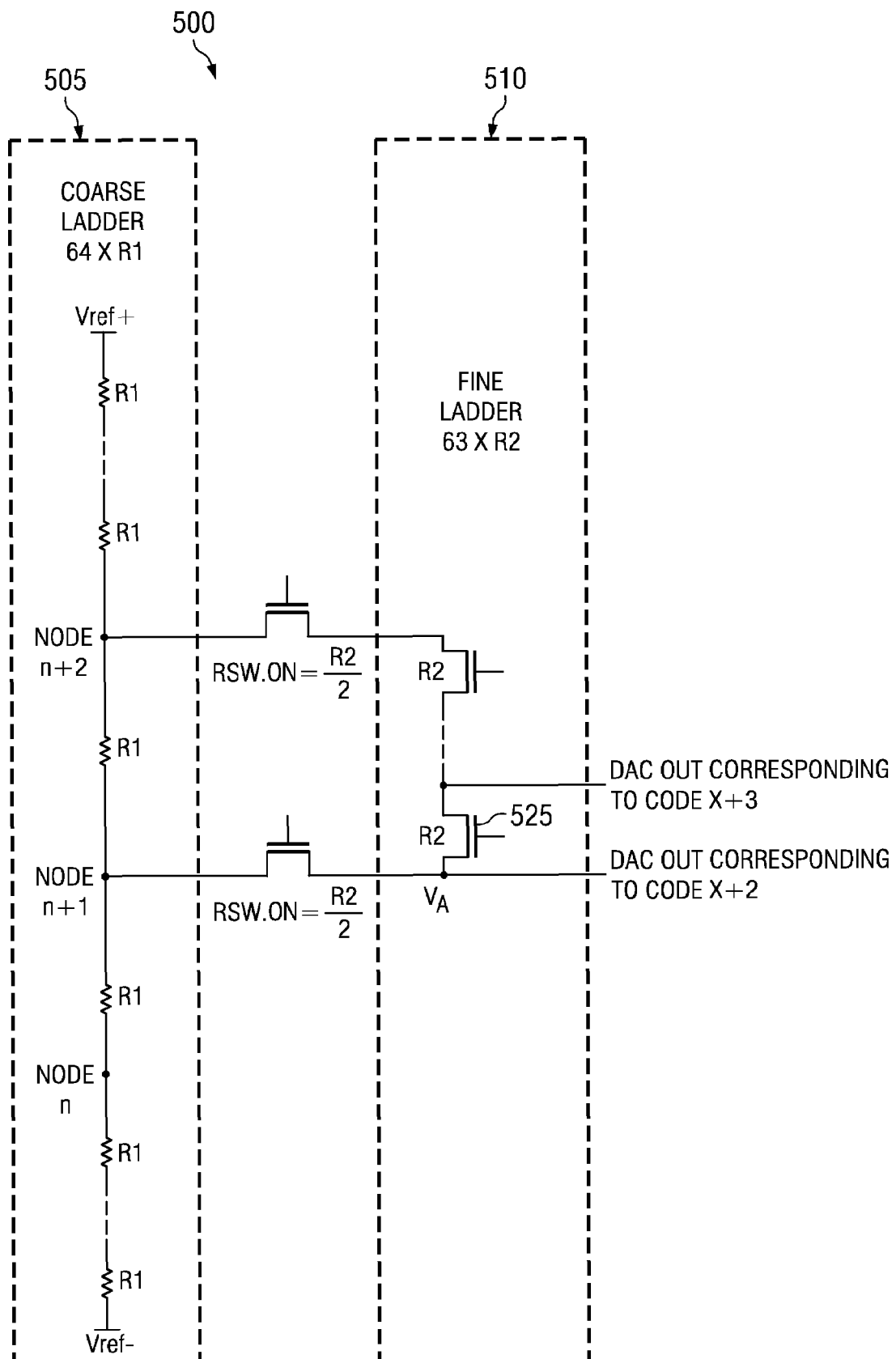

With reference now to FIGS. 5a and 5b, there are shown diagrams illustrating configurations of a dual-resistor ladder DAC 500, wherein transistors operating in a triode region are used as resistors in a fine-resistor ladder, according to a preferred embodiment of the present invention. The dual-resistor ladder DAC 500 as shown in FIGS. 5a and 5b is similar in design to the prior art dual-resistor ladder DAC 200 shown in FIGS. 2a and 2b. Both dual-resistor ladder DACs feature a coarse resistor ladder, such as the coarse resistor ladder 105 (FIG. 2a) and a coarse resistor ladder 505, and a fine resistor ladder, such as the fine resistor ladder 110 (FIG. 2a) and a fine resistor ladder 510. However, rather than poly resistors in the fine resistor ladder 110, the dual-resistor ladder DAC 500 makes use of transistors operating in a triode region as resistors in the fine resistor ladder 510.

In the diagrams shown in FIGS. 5a and 5b, resistors in the fine resistor ladder 510 are actually transistors (e.g., transistor 516, 517, 525, and so forth) operating in the triode region, perfectly matching the transistors used between the coarse resistor ladder 505 and the fine resistor ladder 510. This makes $$R_{SW,ON} = \frac{1}{k'\frac{W}{L}(V_G - V_S - V_T)} = \frac{R_2}{2}$$

quite accurate, that is, it is possible to obtain excellent DNL performance over process and temperature variations. The absolute resistance value of $$R_{SW,ON} = \frac{R_2}{2}$$

may change considerably when the fine resistor ladder 510 is switched to shunt a different resistor in the coarse resistor ladder 505, but the relative resistance of all transistors in the fine resistor ladder 510, including the transistors between the two resistor ladders (the coarse resistor ladder 505 and the fine resistor ladder 510), remain almost constant.

Figure 6A:
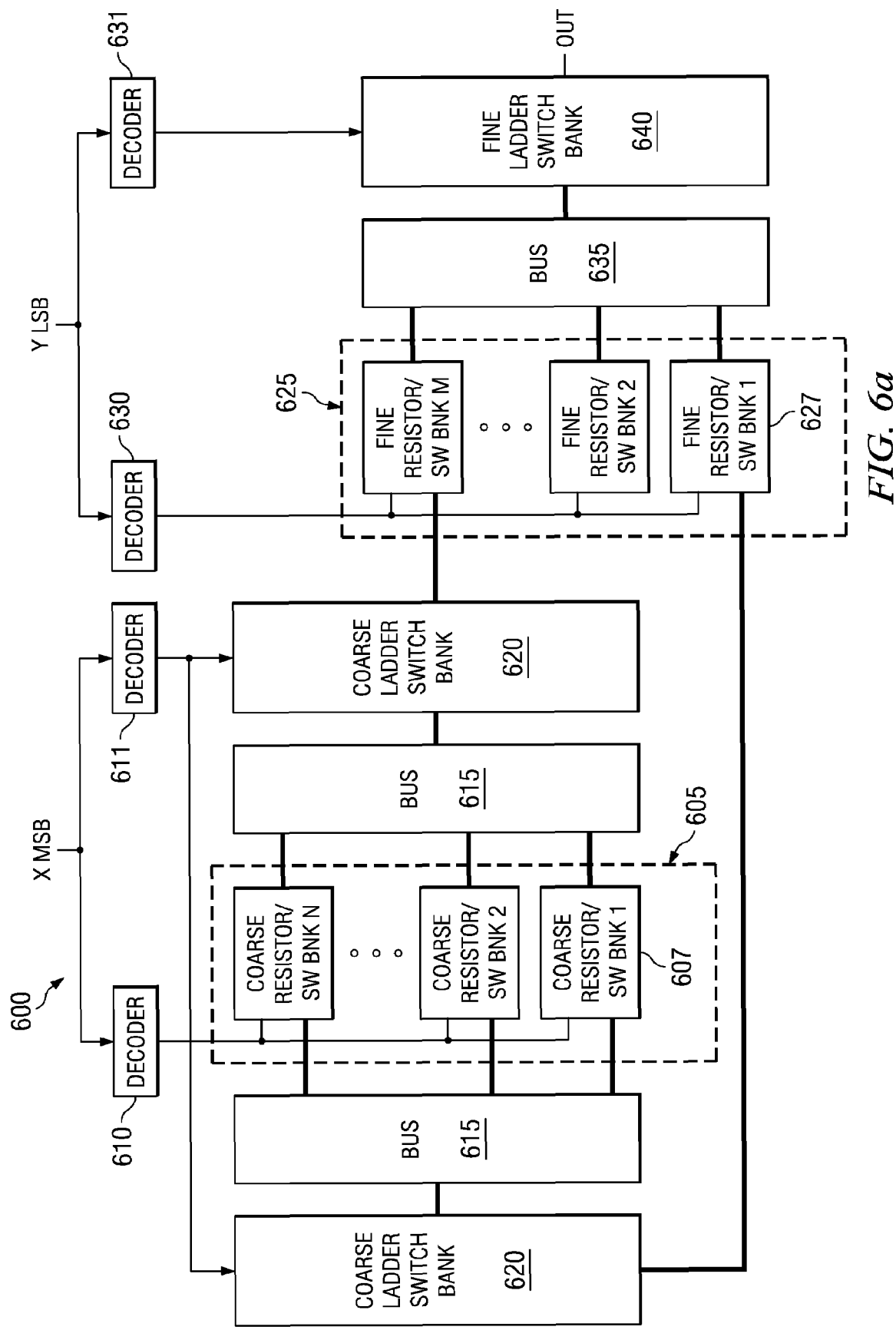
FIGS. 6a through 6h are diagrams of a dual-resistor ladder DAC and detailed views thereof, according to a preferred embodiment of the present invention.

With reference now to FIG. 6a, there is shown a diagram of a high-level view of a dual-resistor ladder DAC 600, according to a preferred embodiment of the present invention. The diagram shown in FIG. 6a illustrates the dual-resistor ladder DAC 600, wherein the dual-resistor ladder DAC 600 features transistors, preferably N-type MOS transistors, operating in a triode region and used as resistors in the fine resistor ladder portion of the dual-resistor ladder DAC 600. As discussed previously, the use of transistors rather than poly resistors can help to eliminate a source for impedance mismatch and therefore improve the DNL of the dual-resistor ladder DAC 600.

The dual-resistor ladder DAC 600 includes a coarse resistor ladder 605 comprised of N coarse resistor/switch banks, such as coarse resistor/switch bank 607. The number of coarse resistor/switch banks is dependent upon a number of binary digits decoded by a first decoder 610 in the coarse resistor ladder 605 and the number of binary digits decoded by a second decoder 611. For example, in a 12 bit dual-resistor ladder DAC, wherein six bits are decoded by the coarse resistor ladder 605 and six bits are decoded by a fine resistor ladder, with a resistor/switch bank of 16 resistors and 16 switches, four coarse resistor/switch banks may be needed. The first decoder 610 is used to select one out of the N coarse resistor/switch banks. Referring to the example discussed above, a 2-to-4 decoder is used to decode two of the six binary digits decoded by the coarse resistor ladder 605 to select one of the four coarse resistor/switch banks.

Every switch in the N coarse resistor/switch banks is coupled to one of two buses, shown in FIG. 6a as bus 615. The use of the bus 615 and associated two-level decoding circuitry can reduce the hardware and circuitry requirements of the decoder 610 used in the coarse resistor ladder and a first decoder 630 used in a fine resistor ladder. For example, in a coarse resistor ladder that uses one-level decoding, an associated decoder needs to select a single resistor, resulting in a decoder with a complexity that is on the order of $2^6=64$, while using two-level decoding, the complexity of the decoder is on the order of $2^3+2^3=16$. A bank of switches, such as switch bank 620, one for each bus, couples the output of the switches in the N coarse resistor/switch banks to either a top terminal or a bottom terminal of the fine resistor ladder 625.

The fine resistor ladder 625 comprises M fine resistor/switch banks, such as fine resistor/switch bank 627. The number of fine resistor/switch banks in the fine resistor ladder 625 is dependent upon the number of binary digits decoded by the first decoder 630 of the fine resistor ladder 625 as well as the number of binary digits decoded by a second decoder 631. With reference back to the example discussed previously, if six bits are decoded by the fine resistor ladder 625 and each fine resistor/switch bank contains eight resistors and switches (one of the fine resistor/switch banks will contain one fewer resistor than the remaining M−1 fine resistor/switch banks), then eight fine resistor/switch banks are needed. The first decoder 630 can be used to select one of the M fine resistor/switch banks. Using the example discussed previously, the first decoder 630 is a 3-to-8 decoder. The first decoder 630 decodes three of the six binary digits provided to the fine resistor ladder 625 to select one of the eight fine resistor/switch banks. Again, the use of two-stage decoding and the fine resistor/switch banks in the fine resistor ladder 625 result in a reduction in the complexity of the digital circuitry compared to one-stage decoding.

Each switch in the M fine resistor/switch banks is coupled to a bus 635 that allows the coupling of the switches to a fine ladder switch bank 640. The fine ladder switch bank 640 permits the coupling of outputs of the switches in the M fine resistor/switch banks to an output of the dual-resistor ladder DAC 600. Using the example discussed previously, the second decoder 631 decodes the remaining three binary digits to select one of the eight outputs from the fine ladder switch bank 640 and provides it to the output of the dual-resistor ladder DAC 600.

Variations in the on-state resistance of transistors used in the coarse resistor ladder 605 and the fine resistor ladder 625 due to differences in $V_T$ for each of the various transistors used as switches (as discussed previously, the equation for the effective resistance of the transistors is $$R_{sw} = \frac{1}{k'\frac{W}{L}(V_G - V_S - V_T)})$$

can lead to poor performance (high DNL) as well as difficulty in designing a dual-resistor ladder DAC that can be used in a wide variety of applications and voltage operating ranges. The present invention can help eliminate the wide variation in the effective resistance of transistors in the fine resistor ladder 625.

The largest variation seen in the effective resistance of the transistors (the on-state resistance of the switches) in the fine resistor ladder 625 occurs when there is a switching from a first position in the coarse resistor ladder 605 to a second position, namely when the fine resistor ladder 625 is switched from a bottom position to a top position of the coarse resistor ladder 605 or vice versa. However, the relative resistance of every resistor in the fine resistor ladder 625 (including the switches in the switching network between the coarse resistor ladder 605 and the fine resistor ladder 625) is relatively constant, which can be for the benefit of DNL performance, regardless of which coarse resistor ladder component is shunted to the fine resistor ladder 625. This can be due to the negligible $V_S$ variation effect in every transistor in the fine resistor ladder 625. For example, if the full output range of a 12-bit dual-resistor ladder DAC as shown in FIG. 6a is 1 volt, then the voltage drop applied across the fine resistor ladder 625, that is, the largest $V_S$ variation of the transistors in the fine resistor ladder 625, is approximately 15.625 milli-volts. Then, if $V_G$ is 3.3 volts and $V_T$ is about 0.75 volts, then the on-state resistance variation between the top of the fine resistor ladder 625 and the bottom of the fine resistor ladder 625 is approximately 1.32%, which corresponds to an error of 0.0132 of a least significant bit weight.

Figure 6B:
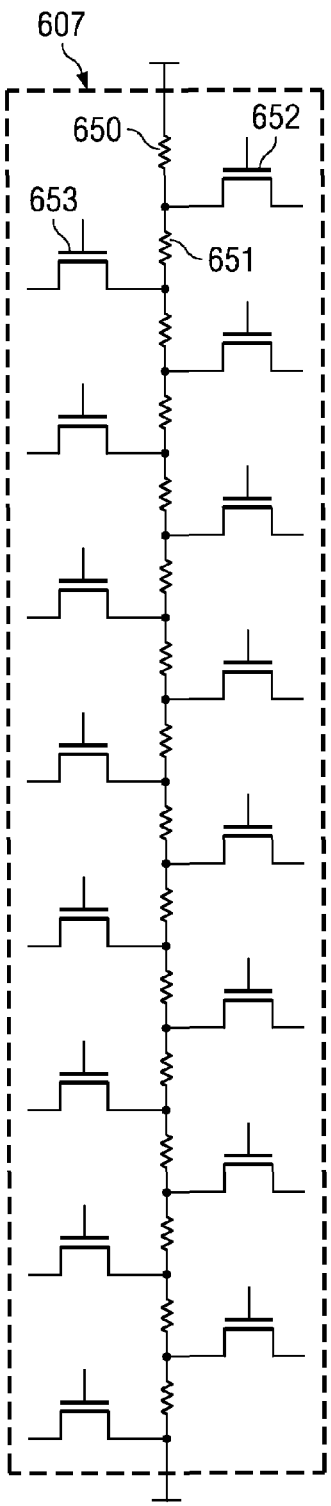

With reference now to FIGS. 6b through 6g, there are shown diagrams illustrating detailed views of portions of the dual-resistor ladder DAC 600, according to a preferred embodiment of the present invention. The diagram shown in FIG. 6b illustrates a detailed view of a coarse resistor/switch bank, such as the coarse resistor/switch bank 607 (FIG. 6a). The coarse resistor/switch bank 607 comprises a linear sequence of resistors. Referencing the example discussed previously, the linear sequence of resistors is made up of 16 resistors, such as resistor 650 and resistor 651. The coarse resistor/switch bank 607 also includes a number of switches arranged in two sequences. According to a preferred embodiment of the present invention, the switches are implemented using N-type MOS transistors. However, other types of transistors can be used as switches, such as P-type MOS transistors, bipolar transistors, transistor transmission gates, and combinations thereof. A first sequence of switches, such as a sequence containing transistor 652, can be coupled to a first terminal of odd numbered resistors, such as resistor 650, and a second sequence of switches, such as a sequence containing transistor 653, can be coupled to a first terminal of even numbered resistors, such as resistor 651.

Figure 6C:
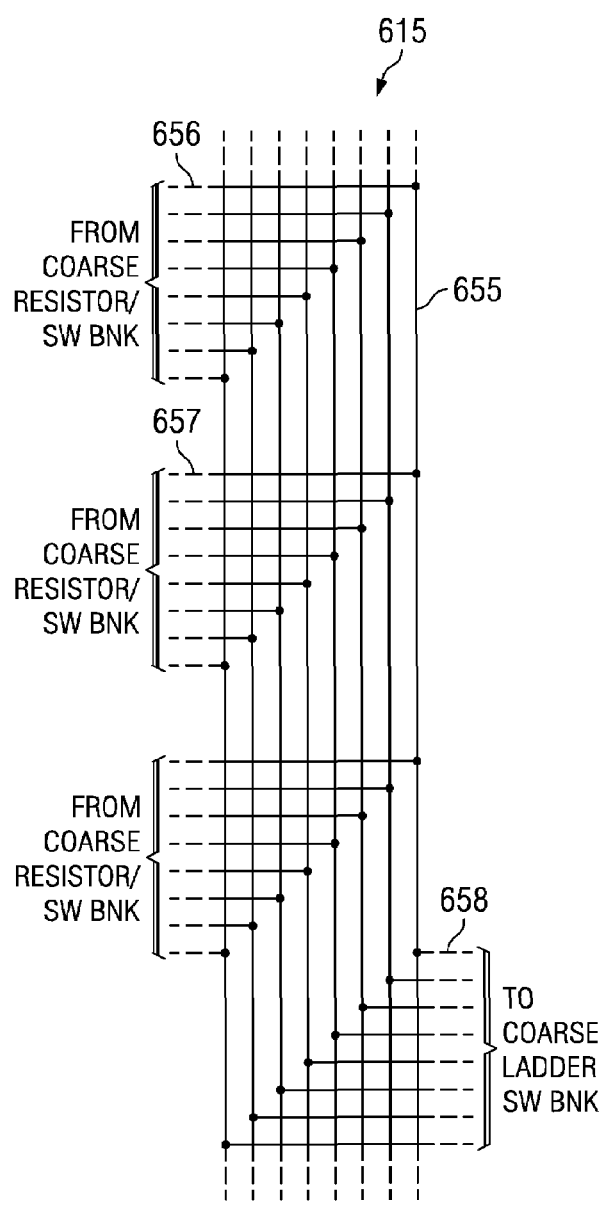

With reference now to FIG. 6c, there is shown a diagram illustrating the bus 615, according to a preferred embodiment of the present invention. The bus 615 permits connectivity of each switch in one of the two sequences of switches in the plurality of coarse resistor/switch banks to switches in the switch bank 620. Referring back to the example discussed previously, the bus 615 includes eight conductive signal lines, such as conductive signal line 655. Each of the eight conductive signal lines in the bus 615 is coupled to one switch in each of the plurality of the coarse resistor/switch banks. As shown in the diagram illustrated in FIG. 6c, the conductive signal line 655 is coupled to a signal line 656 in one coarse resistor/switch bank, a signal line 657 in another coarse resistor/switch bank, and so on. Each of the eight conductive signal lines is also coupled to a signal line coupled to a switch in the switch bank 620. For example, the conductive signal line 655 is coupled to a signal line 658, which in turn is coupled to a switch (not shown) in the switch bank 620.

Figure 6D:
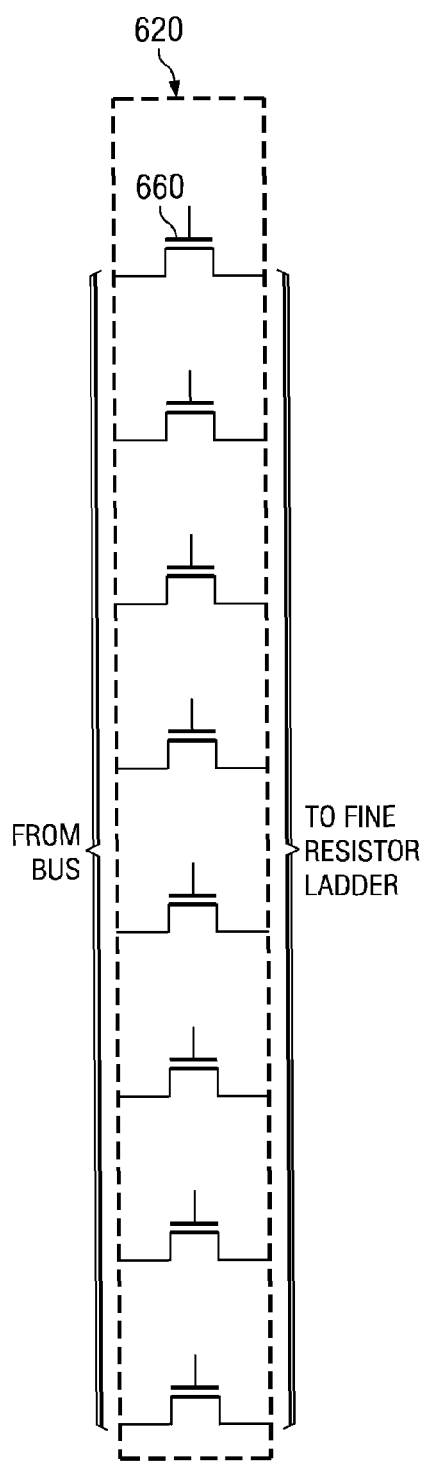

With reference now to FIG. 6d, there is shown a diagram illustrating the switch bank 620, according to a preferred embodiment of the present invention. The switch bank 620 includes a plurality of switches that preferably are implemented using N-type MOS transistors. However, other types of transistors can be used as switches, such as P-type MOS transistors, bipolar transistors, transistor transmission gates, and combinations thereof. The number of switches in the switch bank 620 can be dependent on factors such as the number of binary digits decoded by the coarse resistor ladder decoder 611 as well as the number of switches and resistors in the coarse resistor/switch banks. Referring back to the example discussed previously, the switch bank 620 includes eight switches implemented using N-type MOS transistors, such as transistor 660.

In order to minimize DNL, the total on-state resistance of the switches coupled to the top terminal of the fine resistor ladder 625 and the bottom terminal of the fine resistor ladder 625 should be substantially equal to one-half the resistance of the resistors in the fine resistor ladder 625. Therefore, $R_{sw1}+R_{sw2}=0.5*R_2$, where $R_{sw1}$ is the on-state resistance of transistors in the coarse resistor/switch banks, $R_{sw2}$ is the on-state resistance of transistors in the switch banks of the coarse resistor ladder 605, and $R_2$ is the resistance of the resistors in the fine resistor ladder 625. Since $R_{sw1}$ and $R_{sw2}$ are in series, their effective resistances add. To simplify design, $R_{sw1}$ should be substantially equal to $R_{sw2}$. Then, the relationship between $R_{sw1}$, $R_{sw2}$, and $R_2$ can be simplified to $2*R_{sw1}=0.5*R_2$, hence, $R_{sw1}=0.25*R_2$ or $R_2=4*R_{SW1}$. To further minimize DNL, the on-state resistance of the switches in the coarse resistor ladder 605, such as transistor 652, transistor 653, and transistor 660, should be designed to be 4*W/L so that the resistance between the switches and the fine resistor ladder 625 can be matched.

Figure 6E:
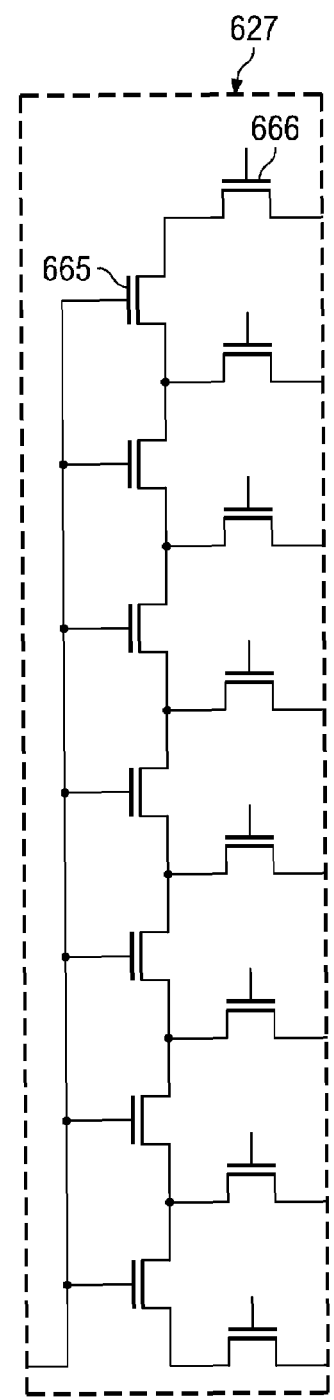

With reference now to FIG. 6e, there is shown a diagram illustrating a fine resistor/switch bank, such as the fine resistor/switch bank 627, according to a preferred embodiment of the present invention. The fine resistor/switch bank 627 includes a series of transistors, such as transistor 665. The transistors operate in a triode region (the gate terminals of the transistors are connected) and function as resistors of the fine resistor ladder 625. According to a preferred embodiment of the present invention, the transistors are sized (a specified width to length ratio) to provide a desired resistance, $R_2$. If the transistors have a resistance $R_2$ and a specific gate width-to-length ratio of W/L, then, complying with the condition ($R_{sw1}=0.25*R_2$ or $R_2=4*R_{SW1}$), the switches in the coarse resistor ladder 605 should be sized so that their gate width-to-length ratio is substantially equal to 4*W/L. A sequence of switches, implemented as transistors, such as transistor 666, are used to couple the transistors operating as resistors in the fine resistor/switch bank 627 to the bus 635. The resistors and switches in the fine resistor/switch bank 627 are implemented using N-type MOS transistors. However, other types of transistors can be used as resistors and switches, such as P-type MOS transistors, CMOS transmission gates, and combinations thereof.

It is possible to use more than a two-step decoding/switching circuit in between the coarse resistor ladder 605 and the fine resistor ladder 625, with a larger number of decoding steps potentially further decreasing the complexity of the decoding/switching circuit and the coarse resistor ladder 605 and the fine resistor ladder 625. For example, a three-step decoding/switching circuit can be used and can be matched resistance wise if each switch in the three-step decoding/switching circuit has an effective resistance substantially equal to $R_2/6$ and if the gate width-to-length ratio of transistors used as fine resistors were W/L, then the gate width-to-length ratio of transistors used as switches between the coarse resistor ladder 605 and the fine resistor ladder 625 can be 6*W/L.

Figure 6F:
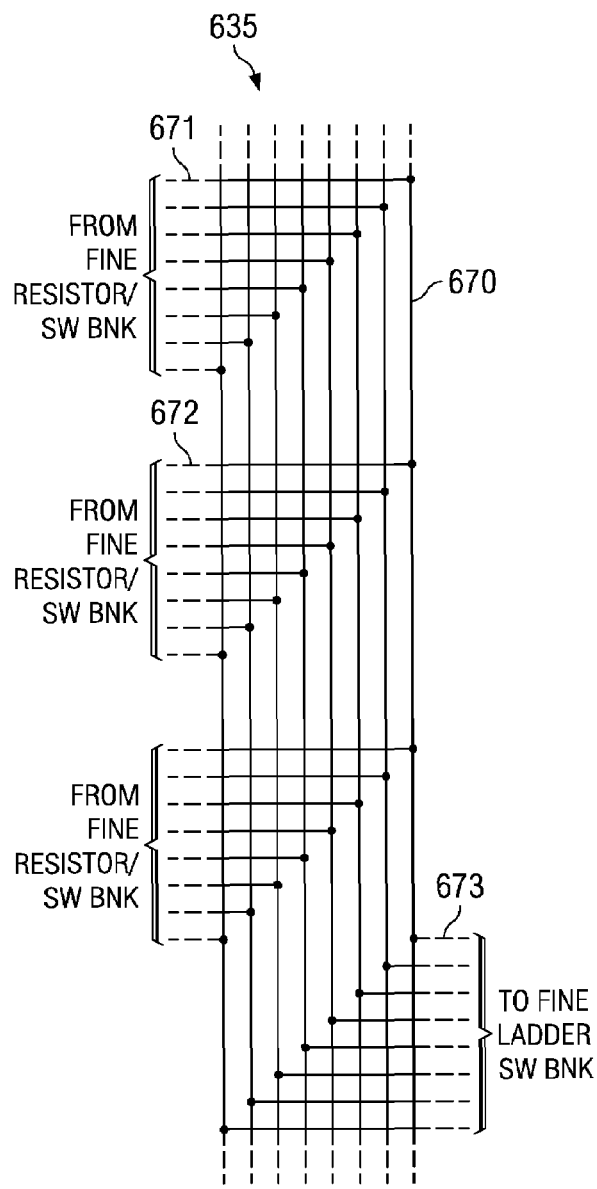

With reference now to FIG. 6f, there is shown a diagram illustrating the bus 635, according to a preferred embodiment of the present invention. The bus 635 permits connectivity of each switch in the plurality of fine resistor/switch banks to switches in the fine ladder switch bank 640. Referring back to the example discussed previously, the bus 635 includes eight conductive signal lines, such as conductive signal line 670. Each of the eight conductive signal lines in the bus 635 is coupled to one switch in each of the plurality of the coarse resistor/switch banks. As shown in the diagram illustrated in FIG. 6f, the conductive signal line 670 is coupled to a signal line 671 in one fine resistor/switch bank, a signal line 672 in another fine resistor/switch bank, and so on. Each of the eight conductive signal lines is also coupled to a signal line coupled to a switch in the fine ladder switch bank 640. For example, the conductive signal line 670 is coupled to a signal line 673, which in turn is coupled to a switch (not shown) in the fine ladder switch bank 640.

Figure 6G:
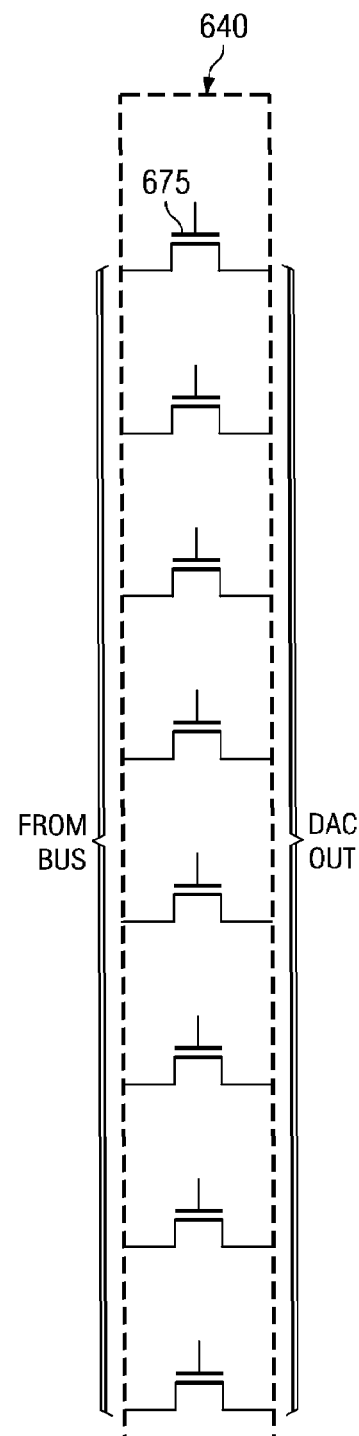
Figure 6H:
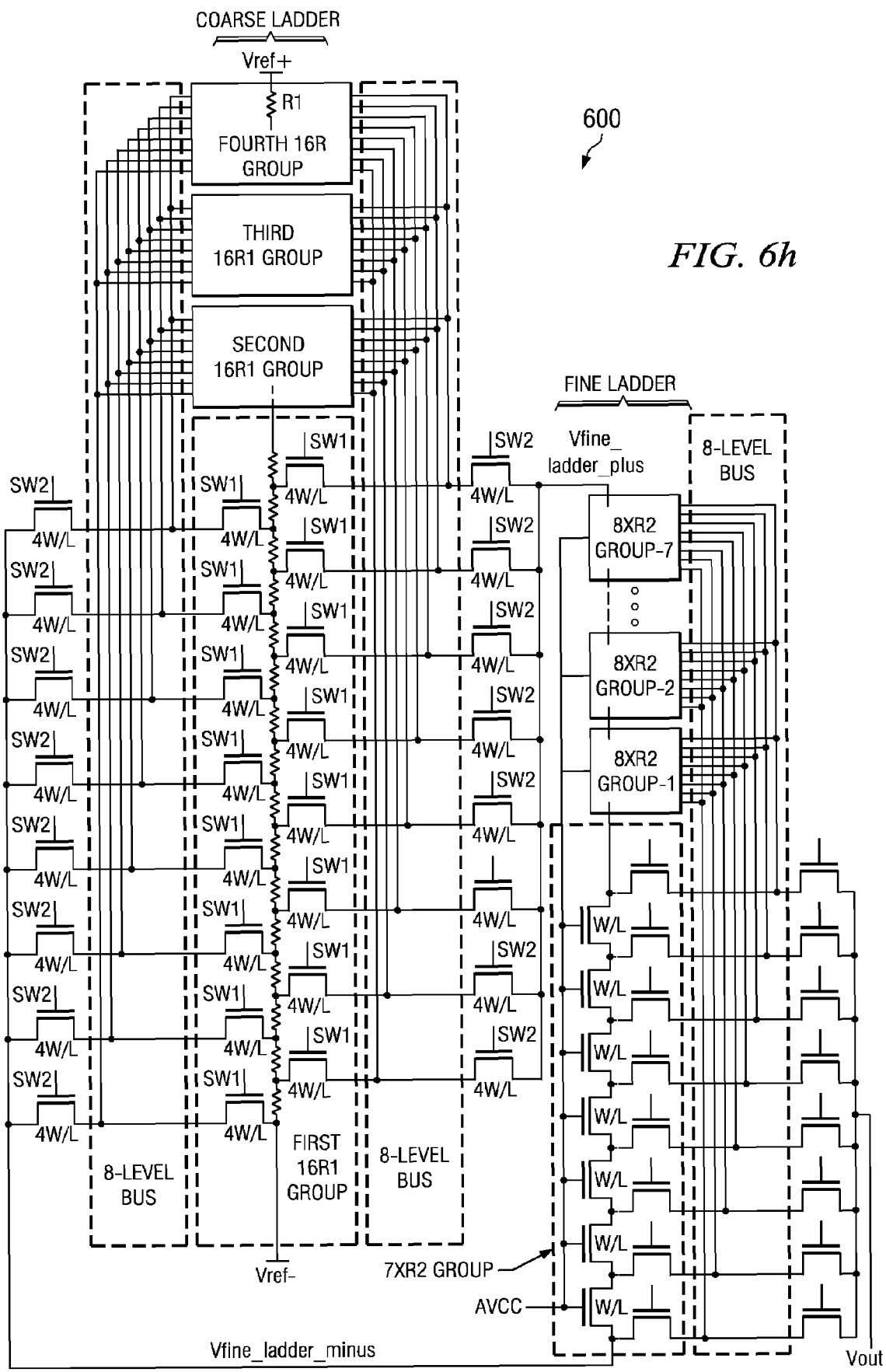

With reference now to FIG. 6g, there is shown a diagram illustrating the fine ladder switch bank 640, according to a preferred embodiment of the present invention. The fine ladder switch bank 640 includes a plurality of switches that preferably are implemented using N-type MOS transistors. However, other types of transistors can be used as switches, such as P-type MOS transistors, CMOS transmission gates, and combinations thereof. The number of switches in the fine ladder switch bank 640 can be dependent on factors such as the number of binary digits decoded by the fine resistor ladder 625 as well as the number of switches and resistors in the coarse resistor/switch banks. Referring back to the example discussed previously, the fine ladder switch bank 640 includes eight switches implemented using N-type MOS transistors, such as transistor 675. A diagram shown in FIG. 6h illustrates a schematic of an exemplary implementation of the dual-resistor ladder DAC 600.

To double the resolution of a dual-resistor ladder DAC, for example, to implement a 15-bit DAC based on a design of a 14-bit DAC, it may be required that the number of resistors in the coarse resistor ladder of the 14-bit DAC be doubled or the number of resistors in the fine resistor ladder of the 14-bit DAC be doubled. Either technique requires a significant increase in the number of resistor devices (for example, transistors operating in the triode region), which can require significantly more silicon area, which can degrade the overall conversion speed performance of the dual-resistor ladder DAC due to greater impedance. In U.S. Pat. No. 5,808,576, entitled "Resistor String Digital-to-Analog Converter," granted Sep. 15, 1998, a technique for doubling the resolution of a dual-resistor ladder DAC by adding a resistor and a switch in series and shunted to a top resistor in the fine resistor ladder and a resistor and a switch in series and shunted to a bottom resistor in the fine resistor ladder of the dual-resistor ladder DAC is disclosed. U.S. Pat. No. 5,808,576 is hereby incorporated by reference.

The decoding of the 14 most significant bits of the 15 bit number (bits <14:1> out of a total of bits <14:0>) can be performed exactly as in a 14-bit dual-resistor ladder DAC, while the least significant bit, bit <0>, can be used to control the state of the switches that are shunted to the top and the bottom resistors in the fine resistor ladder. For example, if bit <0> is equal to zero (0), then the switch shunted to the top resistor is closed and the switch shunted to the bottom resistor is open, while if bit <0> is equal to one (1), then the switch states are reversed.

The fine resistor ladder is switched so that it can be shunted with any resistor in the coarse resistor ladder, therefore, the source terminal potential ($V_S$) of the switches at the top and the bottom resistors of the fine resistor ladder can vary (move up or down) and make the on-state resistance of the switches change. This can affect the equivalent resistance of the top resistor and the bottom resistor, thereby degrading the DNL performance of the doubled DAC. Furthermore, in an actual implementation, to reduce the equivalent resistance variation effect, the switch's W/L ratio is large, so the on-state resistance is much less than the resistance of a resistor in the fine resistor ladder, requiring large switch dimensions. This can lead to a reduction in conversion speed (due to increased parasitic capacitance) and increasing switch glitch (due to a larger charge injection when the switches are turned off). Another contributing factor to DNL degradation includes mismatches due to differences in temperature coefficients and voltage coefficients between the transistor switches and the poly resistors.

Figure 7A:
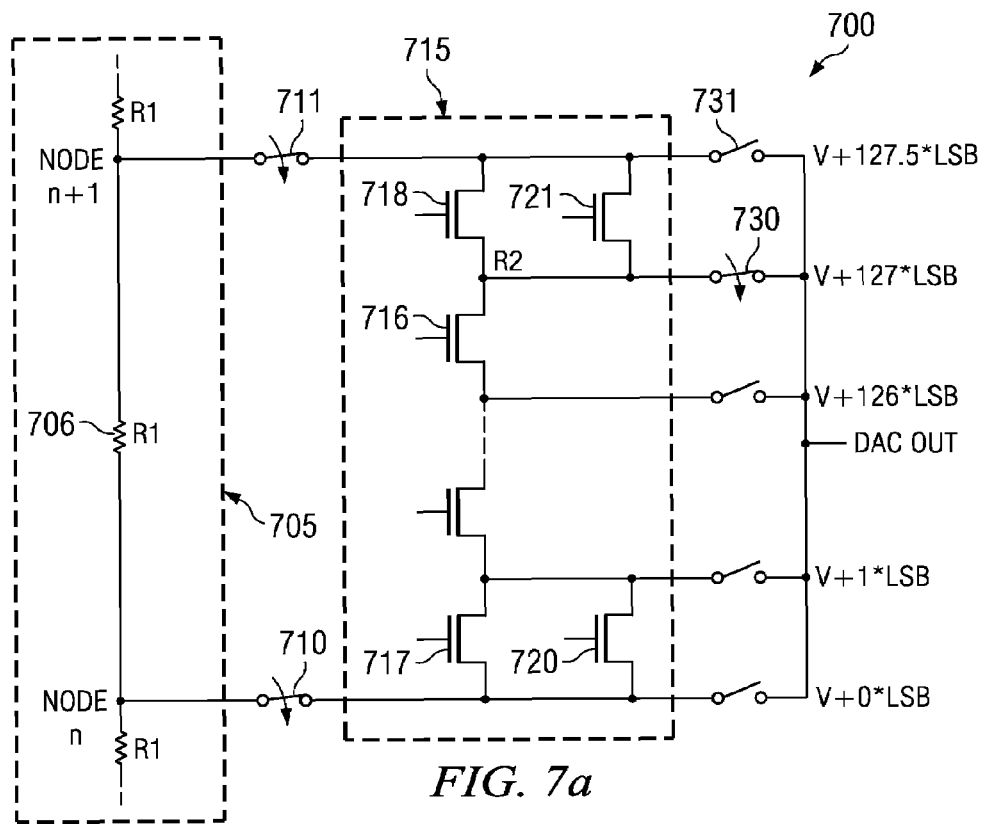
FIGS. 7a and 7b are diagrams of a portion of a dual-resistor ladder DAC wherein additional transistors and switches are utilized to increase the conversion resolution of the DAC, according to a preferred embodiment of the present invention.
Figure 7B:
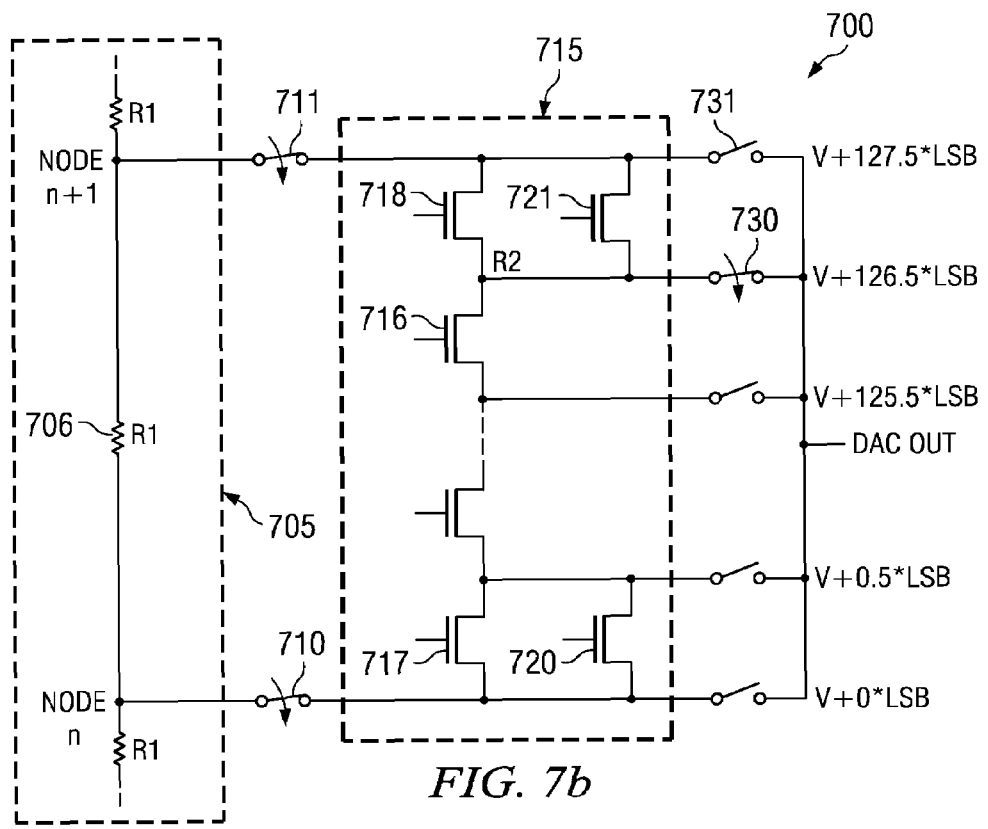

With reference now to FIGS. 7a and 7b, there are shown diagrams illustrating configurations of a dual-resistor ladder DAC 700, wherein the dual-resistor ladder DAC 700 has had its resolution doubled with the effective addition of resistors and switches added to the top and the bottom resistors in its fine resistor ladder, according to a preferred embodiment of the present invention. However, the dual-resistor ladder DAC 700 is not affected by changing equivalent resistance of a top resistor and a bottom resistor of its fine resistor ladder, which can degrade DNL performance, furthermore, large switch dimensions are not needed. Additionally, since the resistors are implemented as transistors, there are no mismatches due to differences in temperature coefficients and voltage coefficients. As shown in FIG. 7a, the dual-resistor ladder DAC 700 includes a coarse resistor ladder 705 that can be made up of a string of resistors (R1), which can include resistor 706. The dual-resistor ladder DAC 700 also includes a fine resistor ladder 715 which can be coupled to terminals of any of the resistors in the coarse resistor ladder 705 by switches, such as switch 710 and switch 711.

The fine resistor ladder 715 can be made up of a string of resistors (R2), which, according to a preferred embodiment of the present invention, are implemented as transistors operating in the triode region and are shown in FIG. 7a as transistors, such as transistor 716, transistor 717, and transistor 718. The transistor 717 is the bottom transistor in the fine resistor ladder 715 and the transistor 718 is the top transistor in the fine resistor ladder 715.

Shunted across the transistor 717 is a transistor 720, which can function as both a switch and a resistor when in an on-state, while shunted across the transistor 718 is a transistor 721, which can also function as both a switch and a resistor when in an on-state. As discussed previously, the state of the switch 720 (implemented as the transistor 720) and the switch 721 (implemented as the transistor 721) can be controlled by the value of the least significant bit of the digital value being converted. Both the transistor 717 and the transistor 720 can have the same value of W/L. Therefore, when the transistor 720 is turned on, the effective resistance of the bottom portion of the fine resistor ladder 715 is half that of when the transistor 720 is turned off. Similarly, when the transistor 721 is turned on, the effective resistance of the top portion of the fine resistor ladder 715 is half that of when the transistor 721 is turned off. The half resistance $$\left(\frac{R_2}{2}\right)$$

of the top unit (when the transistor 721 is turned on) and the bottom unit (when the transistor 720 is turned on) may substantially perfectly match the resistance $R_2$ in the fine resistor ladder 715 over process and temperature variations, which can greatly improve DNL performance as compared to the circuitry disclosed in U.S. Pat. No. 5,808,576. For example, as shown in FIG. 7a, the value of the least significant bit is equal to zero (0) and the switch 721 (implemented as the transistor 721) is closed and the switch 720 (implemented as the transistor 720) is open. While, as shown in FIG. 7b, the value of the least significant bit is equal to one (1) and the switch 721 (implemented as the transistor 721) is open and the switch 720 (implemented as the transistor 720) is closed.

Referring back to FIG. 7a, switches, such as switch 730 and switch 731, couple the output of the dual-resistor ladder DAC 700 to an appropriate node in the fine resistor ladder 715 depending on the value of the digital value. For example, the digital value may be such that the switch 730 is closed and the output of the dual-resistor ladder DAC 700 is equal to V+127*LSB. While as shown in FIG. 7b, the same digital value (with the exception of the least significant bit) would result in the output of the dual-resistor ladder DAC 700 being equal to V+126.5*LSB. Similarly, half LSB level output can be obtained at other nodes in the fine resistor ladder 715. As a result, a DAC with one additional bit of resolution is obtained by adding two transistors, the transistor 720 and the transistor 721.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A digital-to-analog converter (DAC) comprising:
   a first resistor/switch network comprising a first linear sequence of resistors and a first sequence of switches, with each switch in the first sequence of switches having a first terminal coupled to a first terminal of a resistor in the first linear sequence of resistors;
   a second resistor/switch network comprising a second linear sequence of resistors and a second sequence of switches, with a first end of the second linear sequence of resistors coupled to a first switching network and a second end of the second linear sequence of resistors coupled to the second switching network, wherein the resistors in the second linear sequence of resistors are transistors operating in a triode region; and
   a third switching network coupled to the first linear sequence of switches, the third switching network configured to selectively couple a switch in the first linear sequence of switches to an output of the DAC, wherein the state of the switches in the third switching network is determined based upon the values of a first portion of binary digits from the binary number being converted;
   wherein the first switching network comprises a plurality of first switches coupled to the first resistor/switch network, each first switch in the first switching network coupled to a second terminal of an odd numbered switch in the first sequence of switches, wherein the state of the first switches in the first switching network is determined based upon the values of a second portion of binary digits from a binary number being converted; and
   wherein the second switching network comprises a plurality of second switches coupled to the first resistor/switch network, each second switch in the second switching network coupled to a second terminal of an even numbered switch in the first sequence of switches, wherein the state of the switches in the second switching network is determined based upon the values of the second portion of binary digits.

2. A digital-to-analog converter (DAC) comprising:
   a first resistor/switch network comprising a first linear sequence of resistors and a first sequence of switches, with each switch in the first sequence of switches having a first terminal coupled to a first terminal of a resistor in the first linear sequence of resistors;
   a second resistor/switch network comprising a second linear sequence of resistors and a second sequence of switches, with a first end of the second linear sequence of resistors coupled to a first switching network and a second end of the second linear sequence of resistors coupled to the second switching network, wherein the resistors in the second linear sequence of resistors are transistors operating in a triode region; and
   a third switching network coupled to the first linear sequence of switches, the third switching network configured to selectively couple a switch in the first linear sequence of switches to an output of the DAC, wherein the state of the switches in the third switching network is determined based upon the values of a first portion of binary digits from the binary number being converted;
   wherein the first resistor/switch network comprises a plurality of first resistor/switch banks, each first resistor/switch bank being a disjoint subset of the first resistor/switch network;
   wherein the first switching network and the second switching network comprise an equal number of switches; and
   wherein the number of switches is equal to one-half the number of switches in a resistor/switch bank with the largest number of switches.

3. The DAC of claim 2, further comprising a first decoder coupled to each first resistor/switch bank, the first decoder being connected, configured and adapted to selectively enable a first resistor/switch bank based upon the first portion of binary digits.

4. The DAC of claim 3, wherein the enabling comprises closing all switches in the selected first resistor/switch bank.

5. The DAC of claim 2, wherein the second resistor/switch network comprises a plurality of second resistor/switch banks, each second resistor/switch bank being a disjoint subset of the second resistor/switch network.

6. The DAC of claim 5, wherein a second resistor/switch bank has one fewer resistor than the remaining second resistor/switch banks.

7. The DAC of claim 5 further comprising a second decoder coupled to each second resistor/switch bank, the second decoder being connected, configured and adapted to selectively enable a second resistor/switch bank based upon the first portion of binary digits.

8. A digital-to-analog converter (DAC) comprising:
   a first resistor/switch network comprising a first linear sequence of resistors and a first sequence of switches, with each switch in the first sequence of switches having a first terminal coupled to a first terminal of a resistor in the first linear sequence of resistors;
   a second resistor/switch network comprising a second linear sequence of resistors and a second sequence of switches, with a first end of the second linear sequence of resistors coupled to a first switching network and a second end of the second linear sequence of resistors coupled to the second switching network, wherein the resistors in the second linear sequence of resistors are N-type MOS transistors operating in a triode region; and
   a third switching network coupled to the first linear sequence of switches, the third switching network configured to selectively couple a switch in the first linear sequence of switches to an output of the DAC, wherein the state of the switches in the third switching network is determined based upon the values of a first portion of binary digits from the binary number being converted.

9. A digital-to-analog converter (DAC) comprising:
a first resistor/switch network comprising a first linear sequence of resistors and a first sequence of switches, with each switch in the first sequence of switches having a first terminal coupled to a first terminal of a resistor in the first linear sequence of resistors;
a second resistor/switch network comprising a second linear sequence of resistors and a second sequence of switches, with a first end of the second linear sequence of resistors coupled to a first switching network and a second end of the second linear sequence of resistors coupled to the second switching network, wherein the resistors in the second linear sequence of resistors are transistors operating in a triode region; and
a third switching network coupled to the first linear sequence of switches, the third switching network configured to selectively couple a switch in the first linear sequence of switches to an output of the DAC, wherein the state of the switches in the third switching network is determined based upon the values of a first portion of binary digits from the binary number being converted;
wherein transistors are used as switches in the first resistor/switch network, the first switching network, and the second switching network;
wherein the transistors used as resistors in the second resistor/switch network have a gate width-to-length ratio of W/L; Land
wherein the transistors used as switches in the first resistor/switch network, the first switching network, and the second switching network have a gate width-to-length ratio of 4*W/L.

10. A digital-to-analog converter (DAC) comprising:
a first resistor/switch network comprising a first linear sequence of resistors and a first sequence of switches, with each switch in the first sequence of switches having a first terminal coupled to a first terminal of a resistor in the first linear sequence of resistors;
a second resistor/switch network comprising a second linear sequence of resistors and a second sequence of switches, with a first end of the second linear sequence of resistors coupled to a first switching network and a second end of the second linear sequence of resistors coupled to the second switching network, wherein a first resistor in the second linear sequence of resistors is shunted by a first shunt resistor and a first shunt switch linear combination and a last resistor in the second linear sequence of resistors is shunted by a second shunt resistor and a second shunt switch linear combination, wherein the resistors in the second linear sequence of resistors and the first shunt resistor and the second shunt resistor are transistors operating in a triode region; and a third switching network coupled to the second sequence of switches, the third switching network configured to selectively couple a switch in the second sequence of switches to an output of the DAC, wherein the state of the switches in the third switching network is determined based upon the values of a first portion of binary digits from the binary number being converted.

11. The DAC of claim 10, wherein the first shunt switch and the second shunt switch are controlled by a least significant bit of a digital word being converted by the DAC.

12. The DAC of claim 11, wherein the first shunt switch and the second shunt switch are inversely controlled by the least significant bit of the digital word being converted by the DAC.

13. The DAC of claim 11, wherein the switches in the first sequence of switches and the switches in the second sequence of switches are controlled by the remaining bits of the digital word being converted by the DAC.

14. The DAC of claim 10, wherein the resistance of the first shunt resistor and the resistance of the second shunt resistor and the resistances of the resistors in the second linear sequence of resistors are substantially equal.

15. A method for designing a dual-resistor ladder digital-to-analog converter (DAC), the method comprising:
computing a first gate width dimension and a first gate length dimension to meet a desired effective resistance for each transistor used as a resistor in a fine resistor ladder of the dual-resistor ladder DAC; and
computing a second gate width dimension and a second gate length dimension to meet a desired effective resistance for each transistor used as a switch in a switching network coupling a coarse resistor ladder to the fine resistor ladder.

16. The method of claim 15, wherein there are two levels of switches in the switching network, and wherein the desired effective resistance of the transistors used as switches in the switching network is one-fourth that of the transistors used as resistors in the fine resistor ladder.

17. The method of claim 16, wherein the transistors used as resistors in the fine resistor ladder and the transistors used as switches in the switching network are the same type of transistor.

18. The method of claim 17, wherein the transistors used as resistors in the fine resistor ladder and the transistors used as switches in the switching network are N-type metal oxide semiconductor transistors.

19. The method of claim 16, wherein a ratio of gate width-to-length for the transistors used as resistors in the fine resistor ladder is W/L, and wherein a ratio of gate width-to-length for the transistors used as switches in the switching network is 4*W/L.

* * * * *